US011721780B2

United States Patent
Chowdhury et al.

(10) Patent No.: US 11,721,780 B2
(45) Date of Patent: Aug. 8, 2023

(54) AVALANCHE PHOTODETECTORS WITH A MULTIPLE-THICKNESS CHARGE SHEET

(71) Applicant: GlobalFoundries U.S. Inc., Malta, NY (US)

(72) Inventors: Asif Chowdhury, Clifton Park, NY (US); Yusheng Bian, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 66 days.

(21) Appl. No.: 17/528,385

(22) Filed: Nov. 17, 2021

(65) Prior Publication Data
US 2023/0155050 A1 May 18, 2023

(51) Int. Cl.
*H01L 31/107* (2006.01)
*H01L 31/18* (2006.01)
*H01L 31/0352* (2006.01)
*H01L 31/028* (2006.01)

(52) U.S. Cl.
CPC ........ *H01L 31/1075* (2013.01); *H01L 31/028* (2013.01); *H01L 31/035281* (2013.01); *H01L 31/1804* (2013.01)

(58) Field of Classification Search
CPC ............... H01L 31/1075; H01L 31/028; H01L 31/035281; H01L 31/1804
See application file for complete search history.

(56) References Cited

U.S. PATENT DOCUMENTS

| 6,015,721 A * | 1/2000 | Kim ................... H01L 31/03529 438/93 |
| 8,445,992 B2 * | 5/2013 | Hsin ................. H01L 31/03529 257/603 |
| 8,786,043 B2 * | 7/2014 | Huang ................ H01L 31/1075 257/431 |
| 9,525,084 B2 * | 12/2016 | Wang ................ H01L 31/02325 |
| 9,748,429 B1 * | 8/2017 | Davids .................. H01L 31/028 |

(Continued)

OTHER PUBLICATIONS

Zeng, Xiaoge et al., "Low-voltage three-terminal avalanche photodiodes," 2017 Optical Fiber Communications Conference and Exhibition (OFC), 978-1-9435-8027; pp. 1-2 (2017).

(Continued)

*Primary Examiner* — Earl N Taylor
(74) *Attorney, Agent, or Firm* — Thompson Hine LLP; Anthony Canale

(57) ABSTRACT

Structures for an avalanche photodetector and methods of forming a structure for an avalanche photodetector. The structure includes a first semiconductor layer having a first portion and a second portion, and a second semiconductor layer stacked in a vertical direction with the first semiconductor layer. The first portion of the first semiconductor layer defines a multiplication region of the avalanche photodetector, and the second semiconductor layer defines an absorption region of the avalanche photodetector. The structure further includes a charge sheet in the second portion of the first semiconductor layer. The charge sheet has a thickness that varies with position in a horizontal plane, and the charge sheet is positioned in the vertical direction between the second semiconductor layer and the first portion of the first semiconductor layer.

20 Claims, 13 Drawing Sheets

(56) References Cited

U.S. PATENT DOCUMENTS

| | | | | |
|---|---|---|---|---|
| 11,251,326 | B2* | 2/2022 | Szelag | H01L 31/1075 |
| 11,322,636 | B2* | 5/2022 | Chowdhury | H01L 31/107 |
| 2003/0047752 | A1* | 3/2003 | Campbell | H01L 31/1852 |
| | | | | 257/432 |
| 2004/0251483 | A1* | 12/2004 | Ko | H01L 31/035281 |
| | | | | 257/292 |
| 2006/0001118 | A1* | 1/2006 | Boisvert | H01L 31/1075 |
| | | | | 257/438 |
| 2006/0189027 | A1* | 8/2006 | Rhee | H01L 31/03046 |
| | | | | 257/E31.022 |
| 2011/0121423 | A1* | 5/2011 | Forsyth | H01L 21/225 |
| | | | | 257/E21.135 |
| 2011/0291109 | A1* | 12/2011 | Wraback | H01L 31/0312 |
| | | | | 257/77 |
| 2012/0104531 | A1* | 5/2012 | Park | H01L 31/184 |
| | | | | 438/72 |
| 2013/0099091 | A1* | 4/2013 | Nemirovsky | H01L 31/024 |
| | | | | 250/206 |
| 2013/0292741 | A1* | 11/2013 | Huang | H01L 31/1075 |
| | | | | 257/E31.011 |
| 2014/0291682 | A1* | 10/2014 | Huang | H01L 31/1075 |
| | | | | 257/55 |
| 2015/0097256 | A1* | 4/2015 | Ang | H01L 31/02327 |
| | | | | 438/69 |
| 2016/0351743 | A1* | 12/2016 | Yu | G02B 6/12004 |
| 2017/0338367 | A1* | 11/2017 | Novack | H01L 31/02327 |
| 2019/0019899 | A1* | 1/2019 | Wang | H01L 31/02 |
| 2020/0185561 | A1* | 6/2020 | Huang | H01L 31/0312 |
| 2021/0066529 | A1* | 3/2021 | Lu | H01L 27/1461 |
| 2021/0265519 | A1* | 8/2021 | Chowdhury | H01L 31/107 |
| 2022/0050184 | A1* | 2/2022 | Paul | H01L 31/18 |
| 2022/0246784 | A1* | 8/2022 | Shih | H01L 31/1075 |
| 2022/0416097 | A1* | 12/2022 | Kohen | G02B 6/12 |

OTHER PUBLICATIONS

Zhang, Jin et al., "High-Speed Low-Voltage Waveguide-Integrated Ge-on-Si Avalanche Photodiodes," 2020 Optical Fiber Communications Conference and Exhibition (OFC), pp. 1-2 (Sep. 13, 2020).

Zeng, Xiaoge et al., "Silicon-germanium avalanche photodiodes with direct control of electric field in charge multiplication region," Optica Society of America, vol. 6, No. 6, 2334-2536/19/060772-06 Journal, pp. 1-6 (Jun. 2019).

Wang, Binhao et al., "A Low-Voltage Si—Ge Avalanche Photodiode for High-Speed and Energy Efficient Silicon Photonic Links," Journal of Lightwave Technology, 0733-8724(c), pp. 1-8 (2019).

Giewont, Ken et al., "300-mm Monolithic Silicon Photonics Foundry Technology," IEEE Journal of Selected Topics in Quantum Electronics, vol. 25, No. 5, 8200611, pp. 1-12 (Sep./Oct. 2019).

Rakowski, M. et al., "45nm CMOS—Silicon Photonics Monolithic Technology (45CLO) for Next-Generation, Low Power and High Speed Optical Interconnects," 2020 Optical Fiber Communications Conference and Exhibition (OFC), pp. 1-3 (2020).

Frounchi, Milad et. al., "High Responsivity Ge Phototransistor in Commercial CMOS Si-Photonics Platform for Monolithic Optoelectronic Receivers," IEEE Electron Device Letters, vol. 42, No. 2, pp. 196-199 (Feb. 2021).

Sun, Y.T. et al., "An InP/Si heterojunction photodiode fabricated by self-aligned corrugated epitaxial lateral overgrowth," Applied Physics Letters, 106, 213504, pp. 213504-1-213504-5 (May 29, 2015).

Fahs, Bassem et al., "Design and Modeling of Blue-Enhanced and Bandwidth-Extended PN Photodiode in Standard CMOS Technology," IEEE Transactions on Electron Devices, vol. 64, No. 7, pp. 2859-2866 (Jul. 2017).

Abokeaf, A. et al., "Towards fully automated testing and characterization for photonic compact modeling on 300-mm wafer platform," 2021 Optical Fiber Communications Conference and Exhibition (OFC), pp. 1-3 (2021).

* cited by examiner

AVALANCHE PHOTODETECTORS WITH A MULTIPLE-THICKNESS CHARGE SHEET

BACKGROUND

The disclosure relates to semiconductor device fabrication and integrated circuits and, more specifically, to structures for an avalanche photodetector and methods of forming a structure for an avalanche photodetector.

An avalanche photodetector, also known as an avalanche photodiode, is a highly-sensitive semiconductor photodetector that relies upon the photoelectric effect to convert light into countable current pulses. By applying a high reverse bias voltage that is less than the breakdown voltage, an avalanche photodetector exhibits an internal current gain effect because of impact ionization that produces an avalanche effect.

Improved structures for an avalanche photodetector and methods of forming a structure for an avalanche photodetector are needed.

SUMMARY

In an embodiment of the invention, a structure for an avalanche photodetector is provided. The structure includes a first semiconductor layer having a first portion and a second portion, and a second semiconductor layer stacked in a vertical direction with the first semiconductor layer. The first portion of the first semiconductor layer defines a multiplication region of the avalanche photodetector, and the second semiconductor layer defines an absorption region of the avalanche photodetector. The structure further includes a charge sheet in the second portion of the first semiconductor layer. The charge sheet has a thickness that varies with position in a horizontal plane, and the charge sheet is positioned in the vertical direction between the second semiconductor layer and the first portion of the first semiconductor layer.

In an embodiment of the invention, a method of forming a structure for an avalanche photodetector is provided. The method includes forming a first semiconductor layer including a first portion defining a multiplication region of the avalanche photodetector, and forming a charge sheet in a second portion of the first semiconductor layer. The charge sheet has a thickness that varies with position in a horizontal plane. The method further includes forming a second semiconductor layer stacked in a vertical direction with the first semiconductor layer. The second semiconductor layer defines an absorption region of the avalanche photodetector, and the charge sheet is positioned in the vertical direction between the second semiconductor layer and the first portion of the first semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
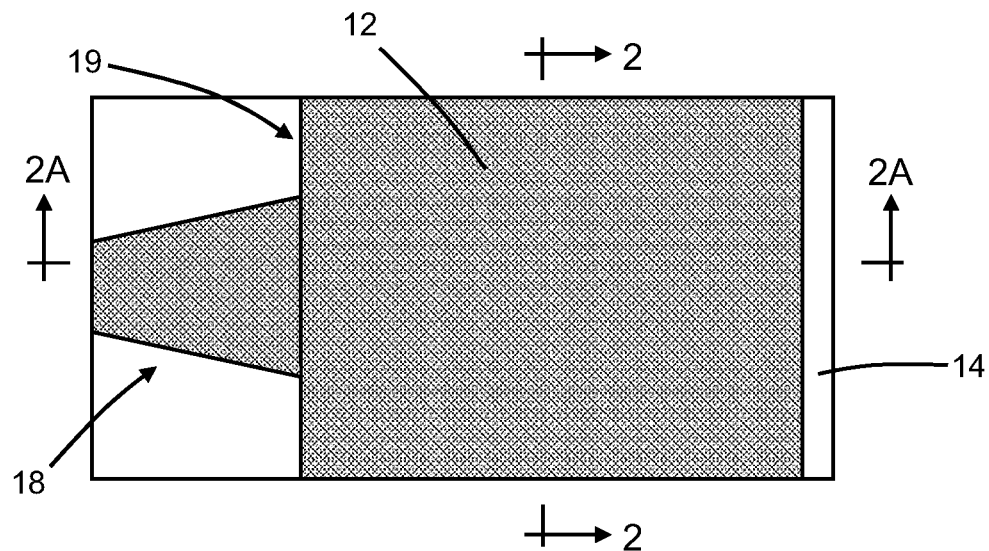
FIG. 1 is a top view of a structure at an initial fabrication stage of a processing method in accordance with embodiments of the invention.
Figure 2:
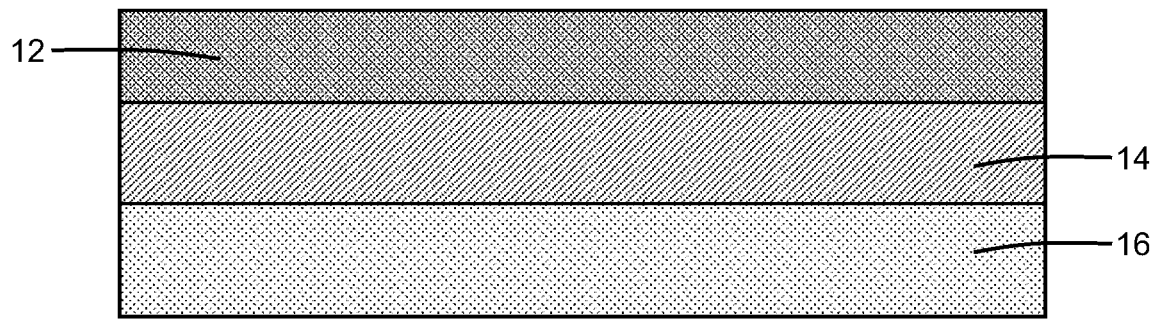
FIG. 2 is a cross-sectional view taken generally along line 2-2 in FIG. 1.
Figure 2A:
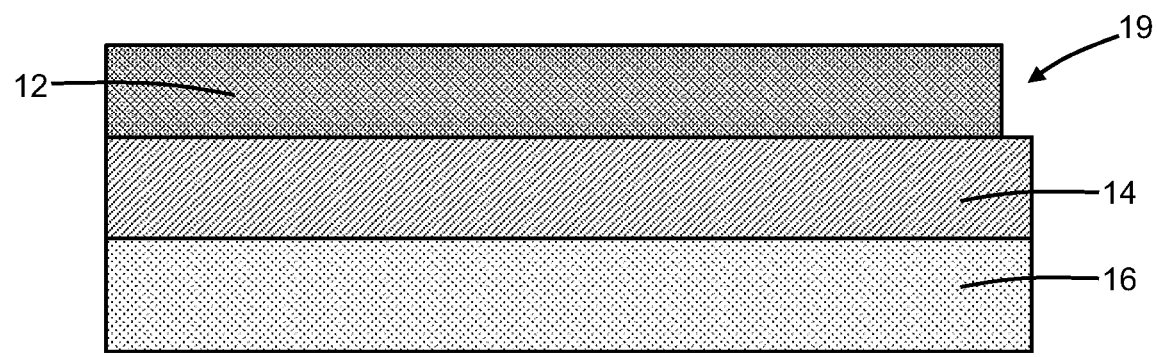
FIG. 2A is a cross-sectional view taken generally along line 2A-2A in FIG. 1.

With reference to FIGS. 1, 2, 2A and in accordance with embodiments of the invention, a semiconductor-on-insulator (SOI) substrate includes a device layer 12, a buried insulator layer 14, and a handle substrate 16. The device layer 12 is separated from the handle substrate 16 by the intervening buried insulator layer 14 and is considerably thinner than the handle substrate 16. The device layer 12 may be comprised of a semiconductor material, such as single-crystal silicon, and may be intrinsic or lightly doped p-type, and the buried insulator layer 14 may be comprised of a dielectric material, such as silicon dioxide. The buried insulator layer 14 is in direct contact with the handle substrate 16 along a lower interface, the buried insulator layer 14 is in direct contact with the device layer 12 along an upper interface, and the lower and upper interfaces are separated by the thickness of the buried insulator layer 14. The device layer 12 is electrically isolated from the handle substrate 16 by the buried insulator layer 14.

The device layer 12 may be patterned by lithography and etching processes to define a pad 19. The pad 19 may be doped to have a given conductivity type. In an embodiment, the pad 19 may be doped (e.g., heavily-doped) by, for example, ion implantation to have n-type conductivity. A taper 18 may couple a waveguide core (not shown) to the pad 19. The taper 18 may be comprised of single-crystal silicon or, alternatively, a layer stack of polysilicon on single-crystal silicon.

Figure 3:
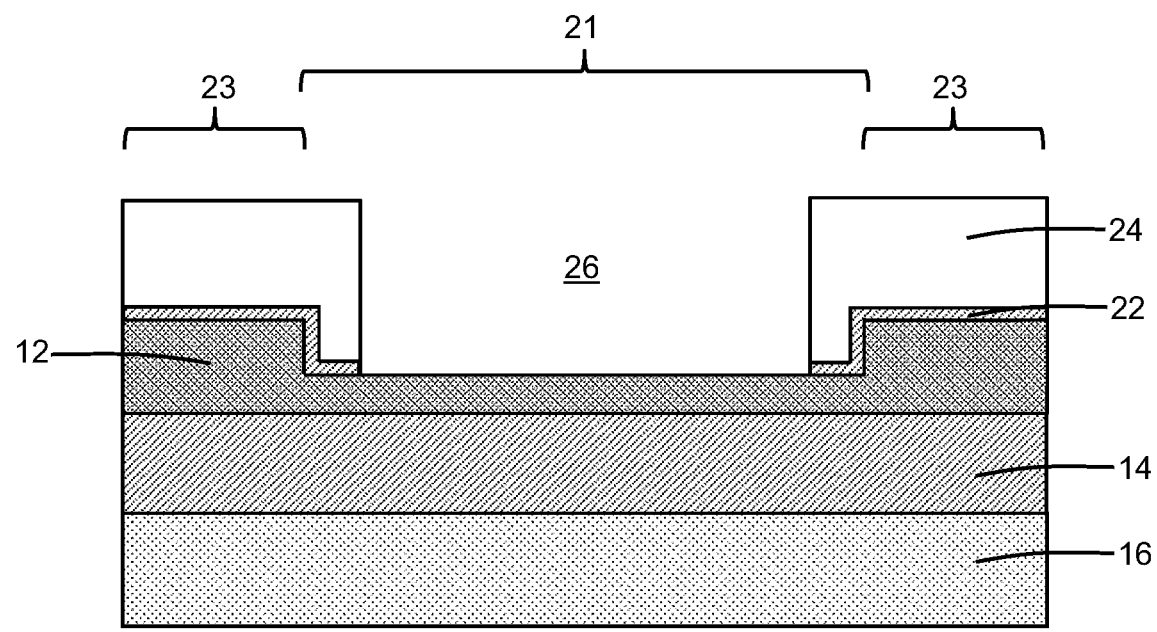
FIGS. 3, 3A are cross-sectional views of the structure at a fabrication stage subsequent to FIGS. 2, 2A.
Figure 3A:
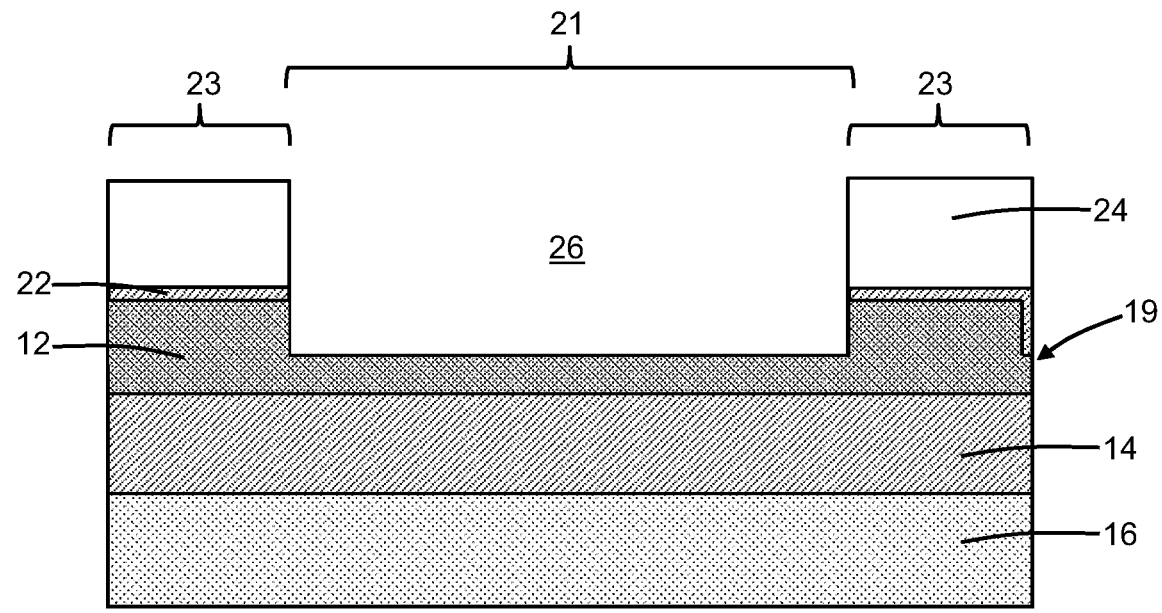

With reference to FIGS. 3, 3A in which like reference numerals refer to like features in FIGS. 2, 2A and at a subsequent fabrication stage of the processing method, the pad 19 includes a recessed portion 21 that is formed by patterning a recess in the device layer 12 with lithography and etching processes. Raised portions 23 of the pad 19 are positioned at the opposite side edges of the recessed portion 21. The raised portions 23, which are masked by the lithographically-formed etch mask during patterning of the recess, retain the original thickness of the device layer 12 before the etching process. The raised portions 23 are raised (i.e., elevated) relative to the recessed portion 21.

A dielectric layer 22 is formed on the recessed portion 21 and raised portions 23 of the pad 19. The dielectric layer 22 may follow the surface profile of the recessed portion 21 and raised portions 23 of the pad 19. In an embodiment, the dielectric layer 22 may be comprised of a dielectric material, such as silicon dioxide, that is conformally deposited.

A hardmask 24 is deposited and patterned by lithography and etching processes to form a window 26 that is located over the recessed portion 21 of the pad 19. In an embodiment, the window 26 may be centered over the recessed portion 21. The hardmask 24 covers peripheral portions of the pad 19, including the raised portions 23. The hardmask 24 may be comprised of a dielectric material, such as silicon nitride. The window 26 in the hardmask 24 is transferred to the dielectric layer 22 by patterning the dielectric layer 22 with an etching process, which exposes a surface area of the recessed portion 21 with the dimensions of the window 26 and from which the dielectric layer 22 is removed.

Figure 4:
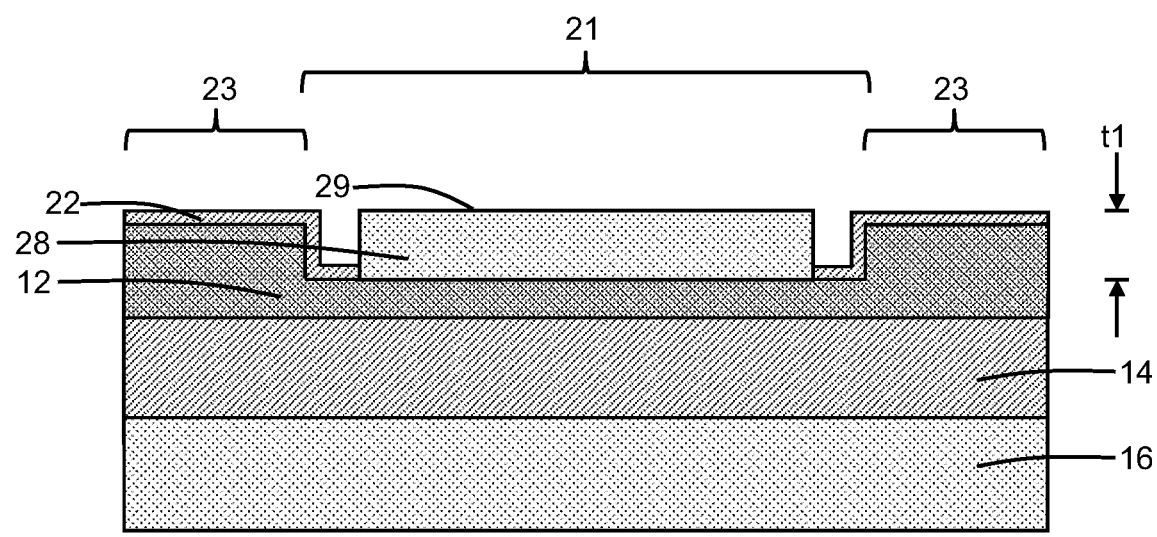
FIGS. 4, 4A are cross-sectional views of the structure at a fabrication stage subsequent to FIGS. 3, 3A.
Figure 4A:
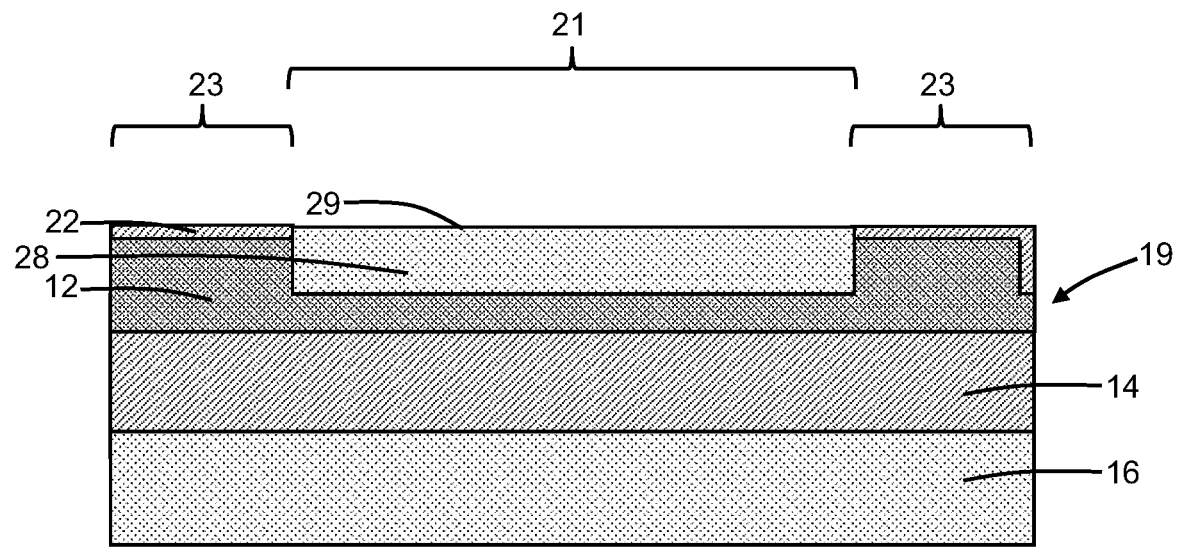

With reference to FIGS. 4, 4A in which like reference numerals refer to like features in FIGS. 3, 3A and at a subsequent fabrication stage of the processing method, the hardmask 24 is removed, and a semiconductor layer 28 is formed on the surface area of the recessed portion 21 of the pad 19 that is not covered by the patterned dielectric layer 22. The semiconductor layer 28 may be comprised of a single-crystal semiconductor material, such as single-crystal silicon. In an embodiment, the semiconductor layer 28 may be undoped and intrinsic following its formation. The semiconductor layer 28 may be formed by an epitaxial growth process. The epitaxial growth process forming the semiconductor layer 28 may be selective in that the single-crystal semiconductor material is permitted to grow from semiconductor material (e.g., the exposed surface area of the recessed portion 21) but not from dielectric material (e.g., the patterned dielectric layer 22). The semiconductor layer 28 has a thickness t1. The thinning of the recessed portion 21 of the pad 19 compensates, at least in part, for the thickness t1 of the semiconductor layer 28 in order to improve planarity.

Figure 5:
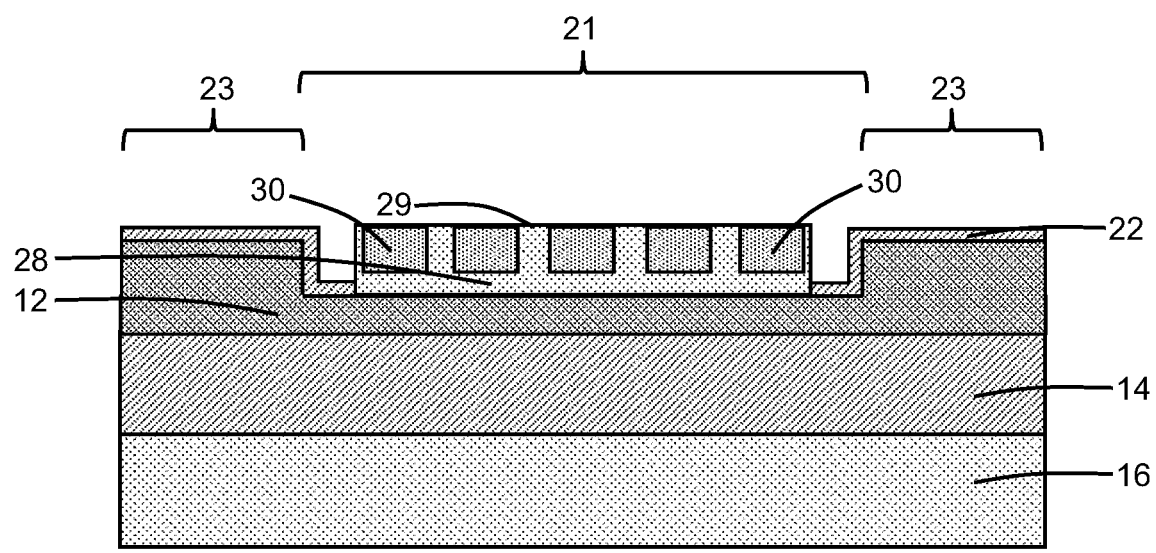
FIGS. 5, 5A are cross-sectional views of the structure at a fabrication stage subsequent to FIGS. 4, 4A.
Figure 5A:
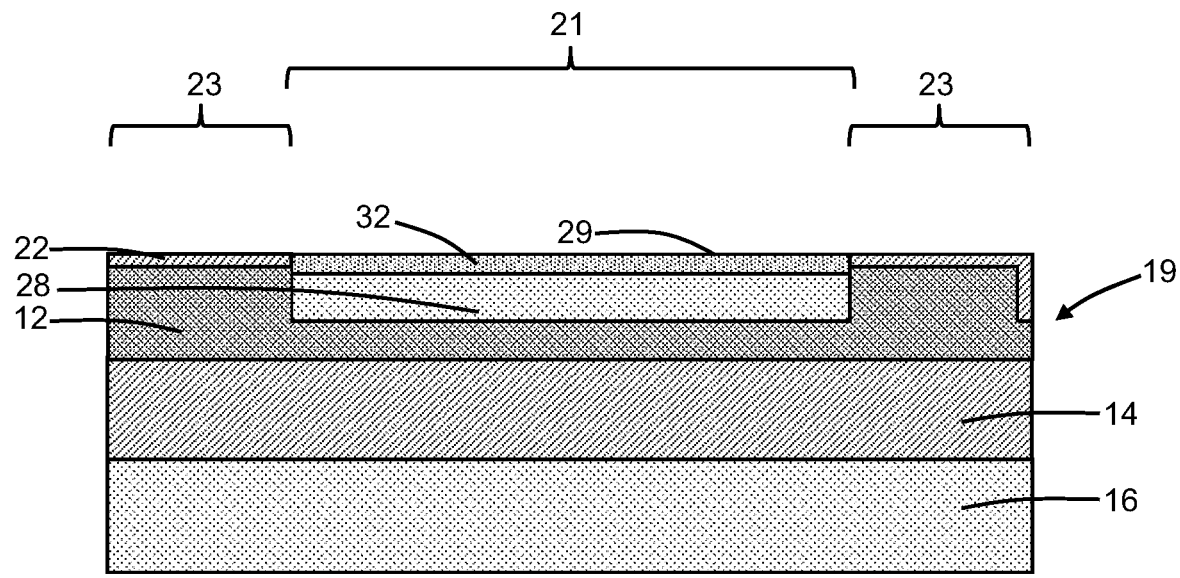

With reference to FIGS. 5, 5A in which like reference numerals refer to like features in FIGS. 4, 4A and at a subsequent fabrication stage of the processing method, doped regions 30 are formed in the semiconductor layer 28 adjacent to an upper surface 29 of the semiconductor layer 28. The doped regions 30 may be arranged in a one-dimensional array of columns constituted by parallel strips of doped semiconductor material that alternate with undoped strips of the semiconductor layer 28 in a horizontal plane. In that regard, portions of the intrinsic semiconductor material of the semiconductor layer 28 are laterally positioned between adjacent pairs of the doped regions 30.

In an embodiment, the doped regions 30 may be formed by, for example, a selective ion implantation process using an implantation mask with openings arranged over different portions of the semiconductor layer 28 targeted to receive implanted ions. The implantation mask may include a layer of photoresist applied by a spin-coating process, pre-baked, exposed to light projected through a photomask, baked after exposure, and developed with a chemical developer to define the openings. The implantation conditions (e.g., ion species, dose, kinetic energy) may be selected to tune the electrical and physical characteristics of the doped regions 30. The implantation mask, which has a thickness adequate to stop the ions, may be stripped after forming the doped regions 30. In an embodiment, the doped regions 30 may receive and contain a p-type dopant (e.g., boron) that provides p-type conductivity.

Figure 6:
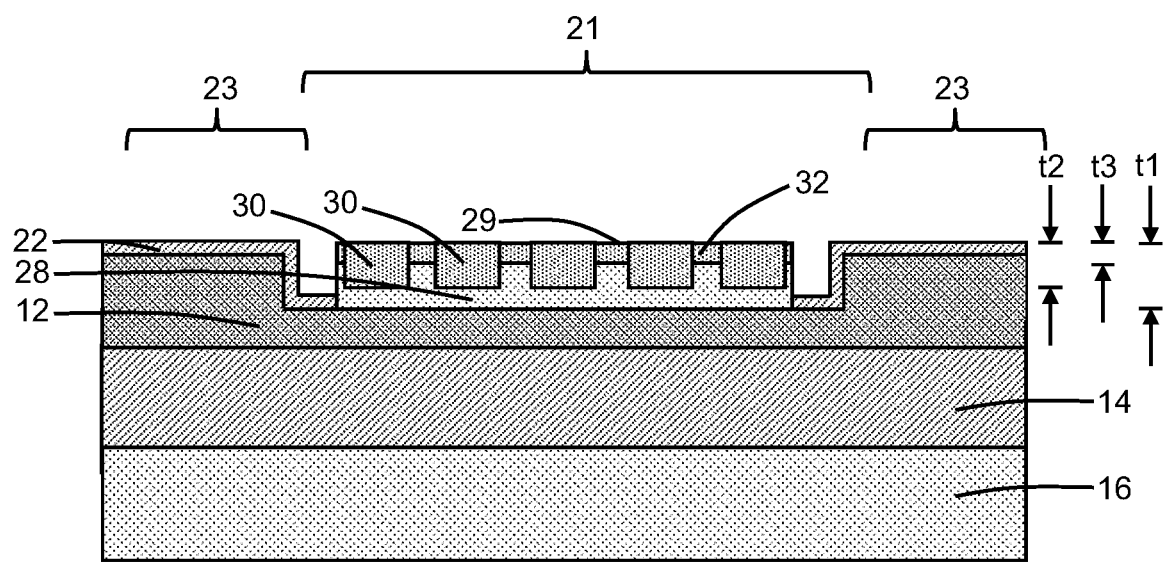
FIGS. 6, 6A are cross-sectional views of the structure at a fabrication stage subsequent to FIGS. 5, 5A.
Figure 6A:
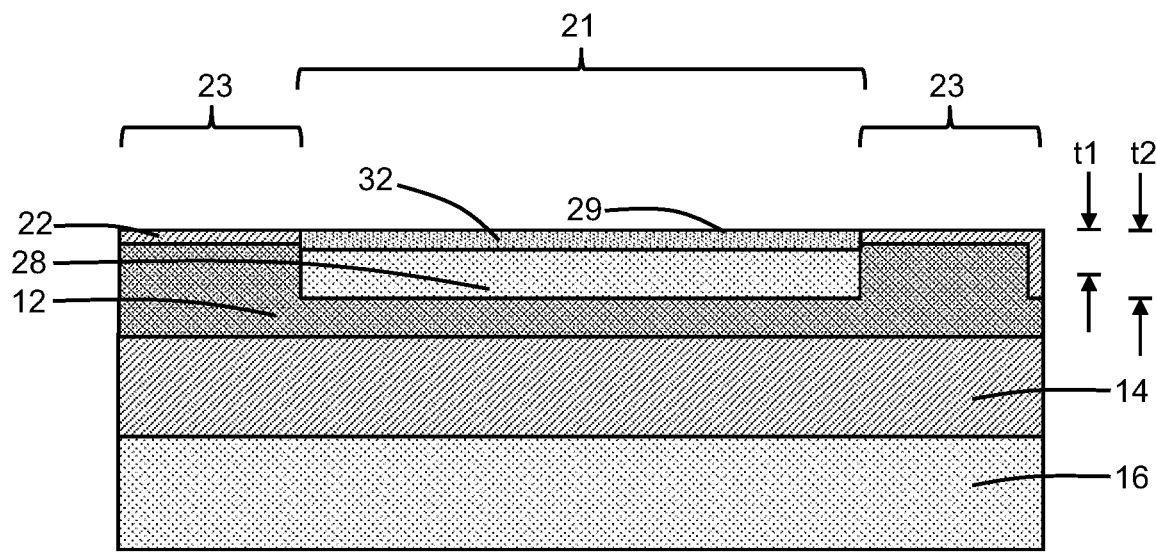

With reference to FIGS. 6, 6A in which like reference numerals refer to like features in FIGS. 5, 5A and at a subsequent fabrication stage of the processing method, a doped layer 32 is formed in the semiconductor layer 28 adjacent to the upper surface 29 of the semiconductor layer 28. In an embodiment, the doped layer 32 may be formed by, for example, a selective ion implantation process using an implantation mask with an opening arranged over the semiconductor layer 28. The implantation mask may include a layer of photoresist applied by a spin-coating process, pre-baked, exposed to light projected through a photomask, baked after exposure, and developed with a chemical developer to define the opening. The implantation conditions (e.g., ion species, dose, energy) may be selected to tune the electrical and physical characteristics of the doped layer 32. The implantation mask, which has a thickness adequate to stop the ions, may be stripped after forming the doped layer 32. In an embodiment, the doped layer 32 may receive and contain a p-type dopant (e.g., boron) that provides p-type conductivity. In an embodiment, the doped regions 30 and the doped layer 32 may both contain a p-type dopant (e.g., boron) that provides p-type conductivity.

The doped layer 32, which is implanted at a lower energy than the doped regions 30, penetrates over a depth range in the semiconductor layer 28 that is shallower than the depth range of the doped regions 30. The doped layer 32 overlaps with, and connects, the doped regions 30 to form a composite doped layer in the semiconductor layer 28. The composite doped layer including the doped regions 30 and doped layer 32 provides a charge sheet used for electric field control in the avalanche photodetector.

The doped regions 30 define corrugations in the charge sheet that face toward the recessed portion 21 of the pad 19. The doped regions 30, which are overlaid on the thinner doped layer 32, provide the charge sheet with a varying thickness (i.e., multiple thicknesses). Specifically, the charge sheet has a thickness t2 at the locations of the doped regions 30 and a thickness t3, which is less than the thickness t2, in the spaces between the doped regions 30. The semiconductor layer 28 includes intrinsic semiconductor material between the charge sheet and the recessed portion 21 of the pad 19. Portions of the intrinsic semiconductor material of the semiconductor layer 28 are positioned in the spaces between adjacent pairs of the doped regions 30.

The intrinsic semiconductor material of the semiconductor layer 28 may define a multiplication region of an avalanche photodetector. The intrinsic semiconductor material of the semiconductor layer 28 has a varying thickness (i.e., multiple thicknesses) that varies with position in a horizontal plane between a thickness equal to a difference between the thickness t1 and the thickness t2 and a larger thickness equal to a difference between the thickness t1 and the thickness t3. As a result, the multiplication region of the avalanche photodetector also includes corrugations that are the complement of the corrugations in the charge sheet.

Figure 7:
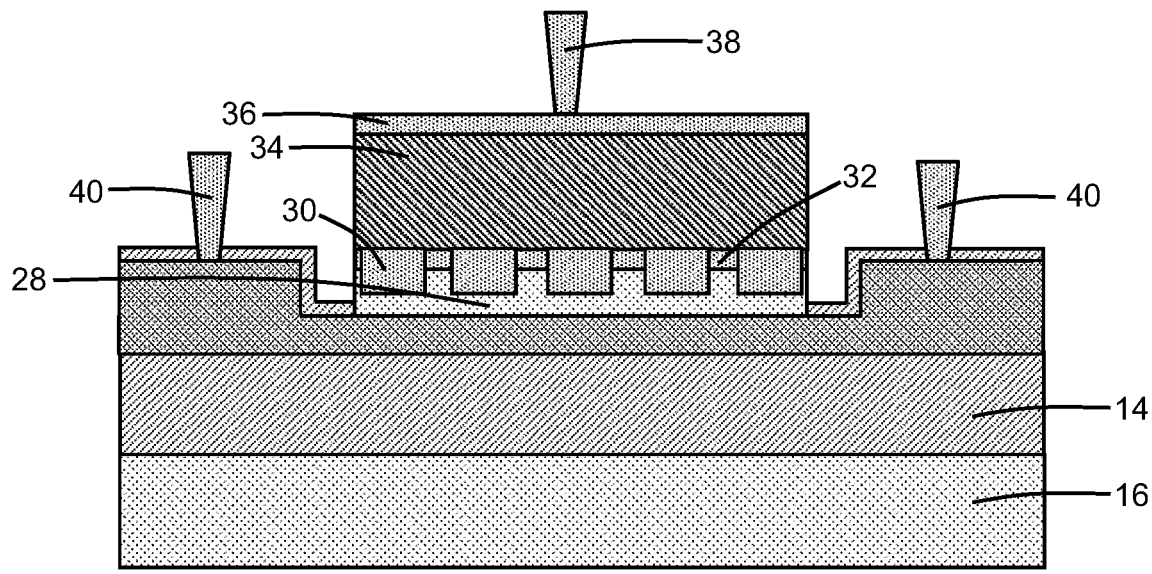
FIGS. 7, 7A are cross-sectional views of the structure at a fabrication stage subsequent to FIGS. 6, 6A.
Figure 7A:
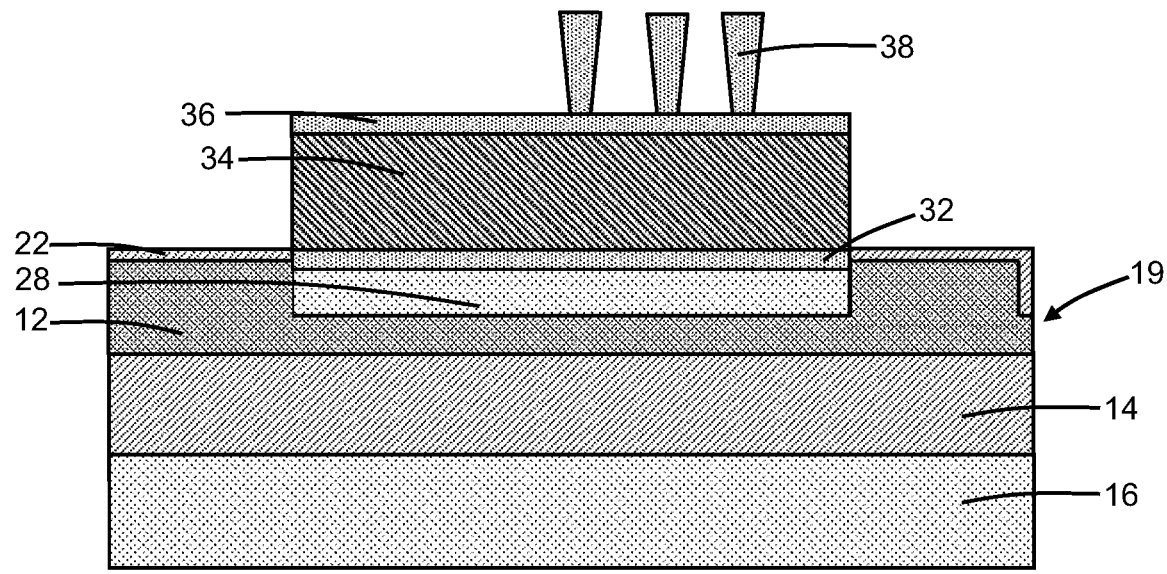

With reference to FIGS. 7, 7A in which like reference numerals refer to like features in FIGS. 6, 6A and at a subsequent fabrication stage of the processing method, a semiconductor layer 34 is formed on the semiconductor layer 28 and is positioned over the charge sheet provided by the doped regions 30 and doped layer 32. The charge sheet provided by the doped regions 30 and doped layer 32 is positioned in a portion of the semiconductor layer 28 adjacent to the semiconductor layer 34. The semiconductor layer 34 may be grown by an epitaxial growth process, such as a selective epitaxial growth process.

The semiconductor layer 34 may be comprised of a semiconductor material that absorbs light and generates charge carriers from the absorbed light. In an embodiment, the semiconductor layer 34 may comprise a semiconductor material having a composition that includes intrinsic germanium. In an embodiment, the semiconductor layer 34 may comprise a semiconductor material having a composition that exclusively includes germanium.

A doped layer 36 is formed in the semiconductor layer 34 and is located adjacent to an upper surface of the semiconductor layer 34. In an embodiment, the doped layer 36 may be formed by, for example, a selective ion implantation process using an implantation mask. The implantation conditions (e.g., ion species, dose, kinetic energy) may be selected to tune the electrical and physical characteristics of the doped layer 36. In an embodiment, the doped layer 36 may receive and contain a p-type dopant (e.g., boron) that provides p-type conductivity. In an embodiment, the doped layer 36 and the charge sheet may contain a dopant (e.g., a p-type dopant) of the same conductivity type. The intrinsic semiconductor material of the semiconductor layer 34, which is positioned in a vertical direction between the doped layer 36 and the charge sheet of the avalanche photodetector, defines an absorption region of the avalanche photodetector.

Contacts 38 are formed that are electrically and physically connected to the doped layer 36. Contacts 40 are formed that are electrically and physically connected to the raised portions 23 of the pad 19. The contacts 38, 40 may be formed in contact openings patterned in a dielectric layer that is formed over the avalanche photodetector.

In use, incident radiation is absorbed in the absorption region of the avalanche photodetector defined by the semiconductor layer 34, and signal amplification occurs in the multiplication region defined by the unimplanted portion of the semiconductor layer 28. When incident photons are absorbed in the absorption region, electron-hole pairs are created, and the electrons drift into the multiplication region. An avalanche current is generated in the multiplication region by the creation of additional electron-hole pairs through impact ionization. The avalanche photodetector is biased below the breakdown voltage to collect the avalanche current. The charge sheet including the doped regions 30 and doped layer 32 is used to control the electric field in the multiplication and absorption regions. The collected avalanche current provides a detectable electronic signal that can be output from the avalanche photodetector in a current path through the contacted raised portions 23 of the pad 19.

The vertically-stacked arrangement of the absorption region, charge sheet, and multiplication region that includes a charge sheet of varying thickness and a multiplication region of varying thickness may reduce the dark current in comparison with conventional avalanche photodetectors. The multiple-thickness charge sheet and multiplication region may provide a gain enhancement in comparison with conventional avalanche photodetectors. The thickness of the semiconductor layer 34 may be chosen to achieve a desired bandwidth, which permits bandwidth selection to be based at least in part upon a readily-adjustable parameter.

Figure 8:
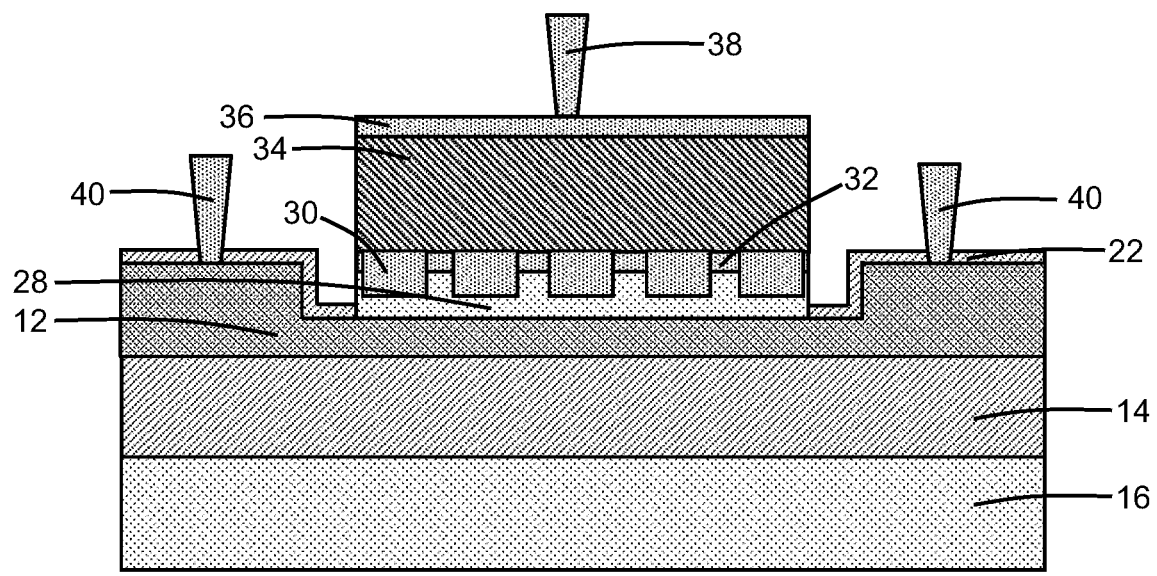
FIGS. 8, 8A are cross-sectional views of a structure in accordance with alternative embodiments.
Figure 8A:
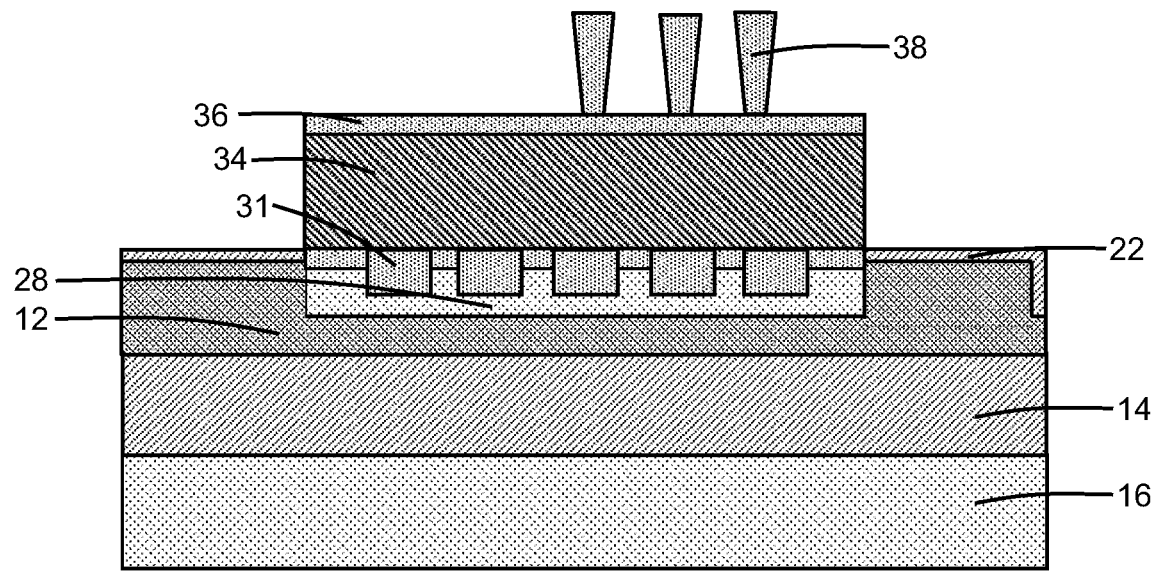

With reference to FIGS. 8, 8A and in accordance with alternative embodiments, the implantation mask used to form the doped regions 30 may be modified to add doped regions 31 that are oriented to intersect the doped regions 30 and define a grid of doped regions 30, 31. The doped regions 31 may be constituted by spaced-apart strips of doped semiconductor material that are oriented or aligned, in a horizontal plane, transverse to the spaced-apart strips of doped semiconductor material constituted by the doped regions 30. In an embodiment, the doped regions 30 may be formed in the columns of the grid and the doped regions 31 may be formed in the rows of the grid. The doped layer 32 is overlaid on the doped regions 30 and on the doped regions 31 to provide the multiple thicknesses for the charge sheet.

Intrinsic semiconductor material of the semiconductor layer 28 is located in the interstices between the doped regions 30, 31 in the grid. The semiconductor layer 28 in the interstices has a varying thickness that varies in a lateral direction between a thickness equal to a difference between the thickness t1 and the thickness t2 and a larger thickness equal to a difference between the thickness t1 and the thickness t3.

Figure 9:
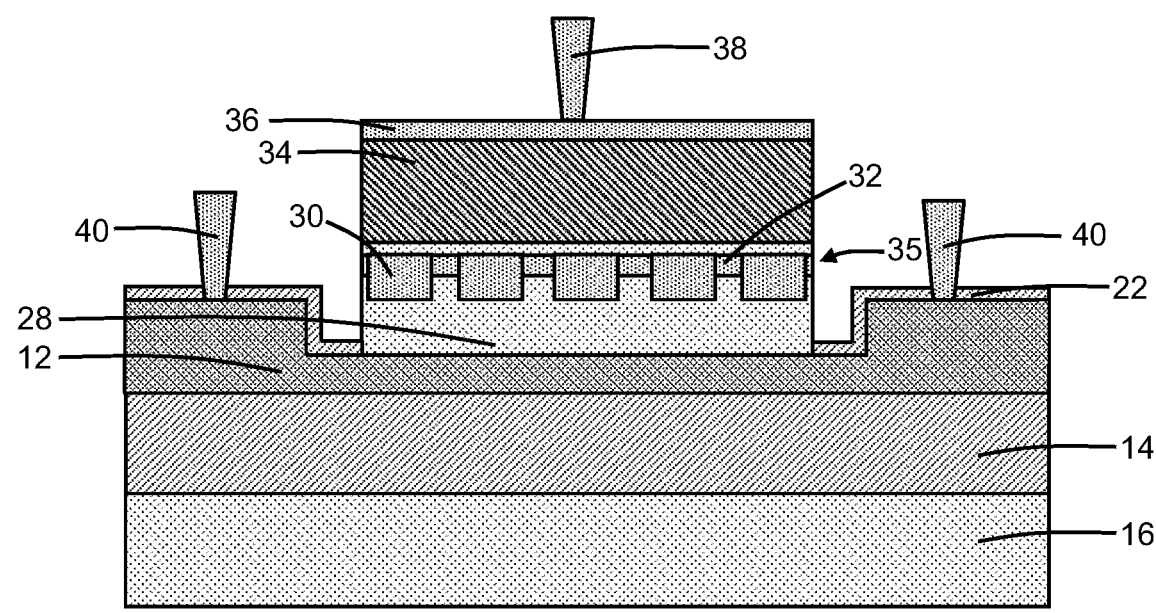
FIGS. 9, 9A are cross-sectional views of a structure at a fabrication stage of a processing method in accordance with alternative embodiments of the invention.
Figure 9A:
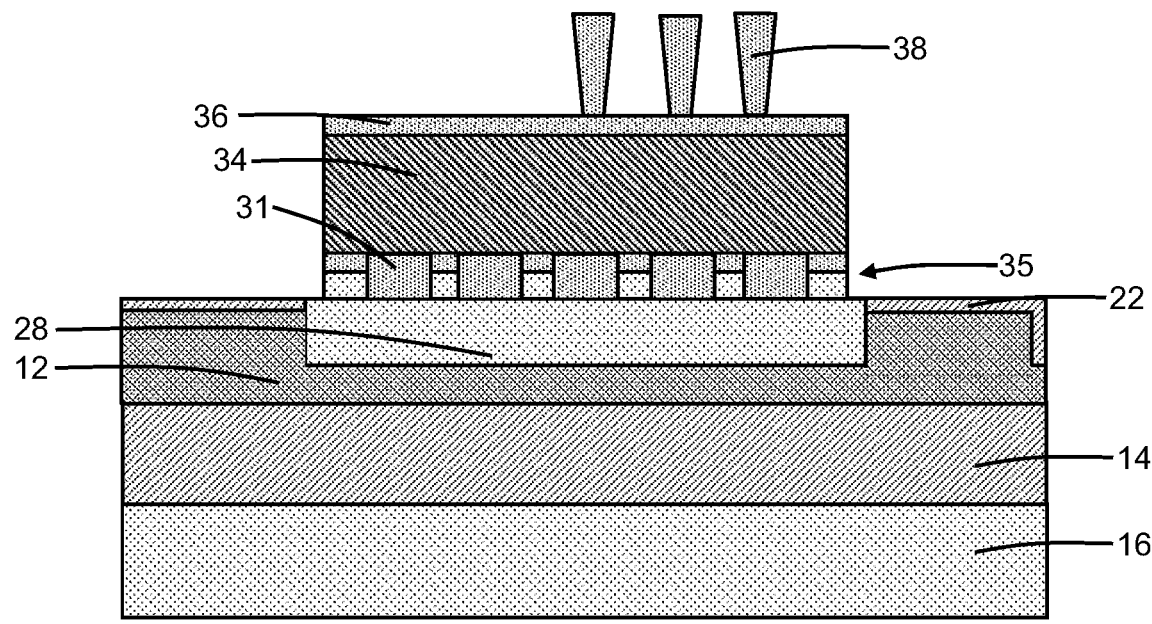

With reference to FIGS. 9, 9A and in accordance with alternative embodiments, the semiconductor layer 28 may be deposited with a greater thickness and an upper portion of the thicker semiconductor layer 28 may be patterned to define a mesa 35. The mesa 35 is elevated relative to a lower portion of the semiconductor layer 28. The doped regions 30 and doped layer 32 may be formed in the mesa 35, and the semiconductor layer 34 may be formed on the mesa 35. In the representative embodiment, the doped regions 30, 31 may be formed in the rows and columns of a grid. In an alternative embodiment, the doped regions 30 may be formed as laterally-spaced strips as columns in a one-dimensional array.

Figure 10:
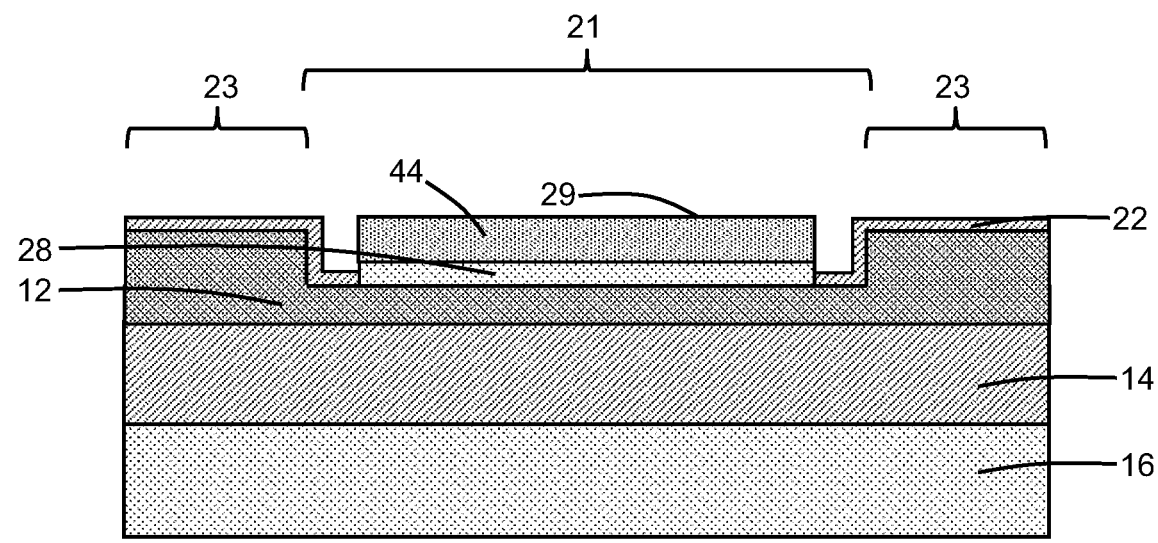
FIGS. 10, 10A are cross-sectional views of the structure at a fabrication stage subsequent to FIGS. 9, 9A.
Figure 10A:
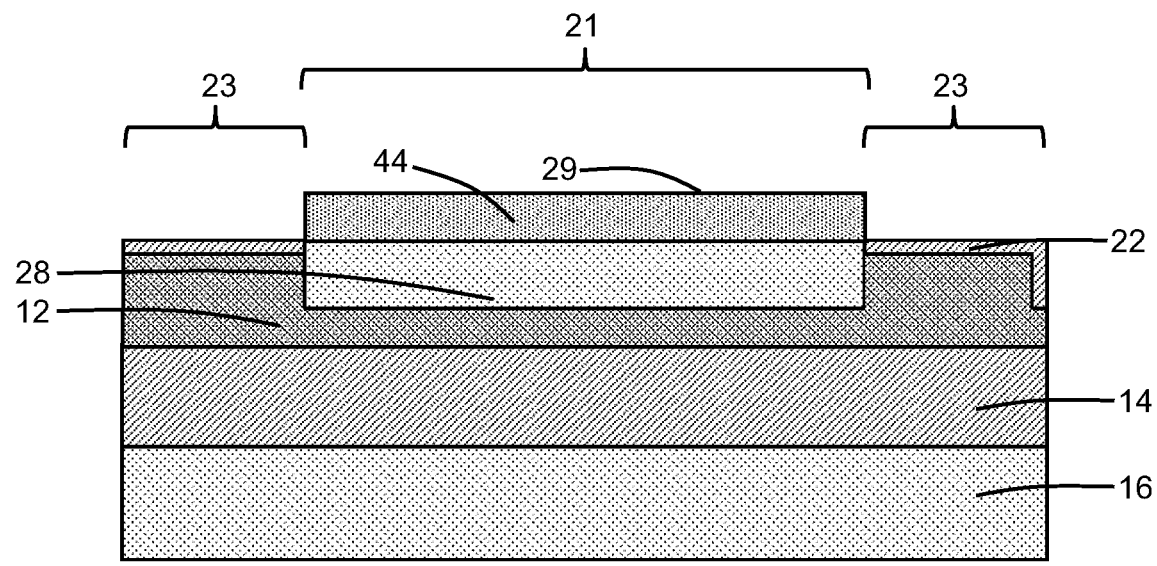

With reference to FIGS. 10, 10A and in accordance with alternative embodiments, a doped layer 44 may be formed in an upper portion of the semiconductor layer 28 adjacent to the upper surface 29 of the semiconductor layer 28. In an embodiment, the doped layer 44 may be formed by, for example, a selective ion implantation process using an implantation mask with an opening arranged over the entire surface area of the upper surface 29 of the semiconductor layer 28. In an embodiment, the semiconductor material of the doped layer 44 may receive and contain a p-type dopant (e.g., boron) that provides p-type conductivity.

Figure 11:
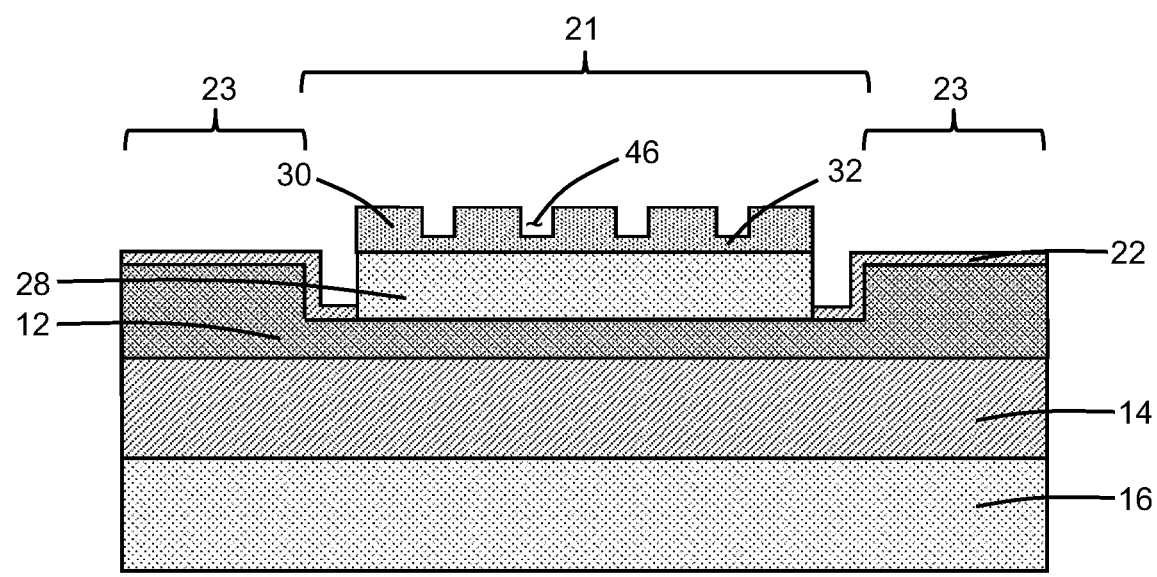
FIGS. 11, 11A are cross-sectional views of the structure at a fabrication stage subsequent to FIGS. 10, 10A.
Figure 11A:
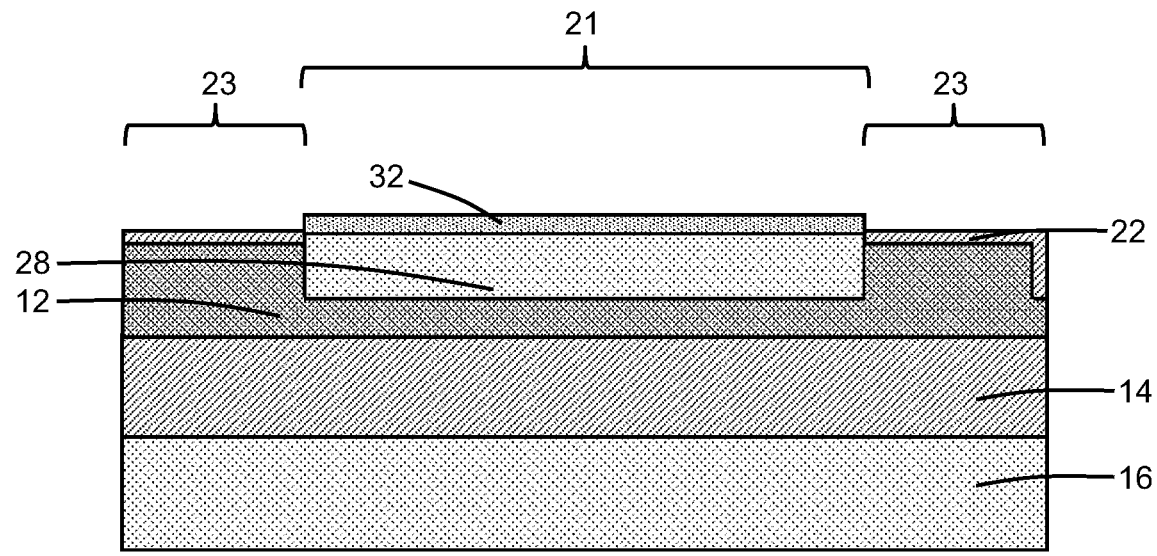

With reference to FIGS. 11, 11A in which like reference numerals refer to like features in FIGS. 10, 10A and at a subsequent fabrication stage of the processing method, the semiconductor layer 28 may be patterned by lithography and etching processes to define trenches 46 that extend partially through the doped layer 44 (FIGS. 8, 8A) to define the doped regions 30 and the doped layer 32 that is overlaid on the doped regions 30. The trenches 46 may be aligned parallel with respect to each other. The doped regions 30 defined by the patterning of the trenches 46 are arranged in a one-dimensional array constituted by parallel strips of doped semiconductor material.

Figure 12:
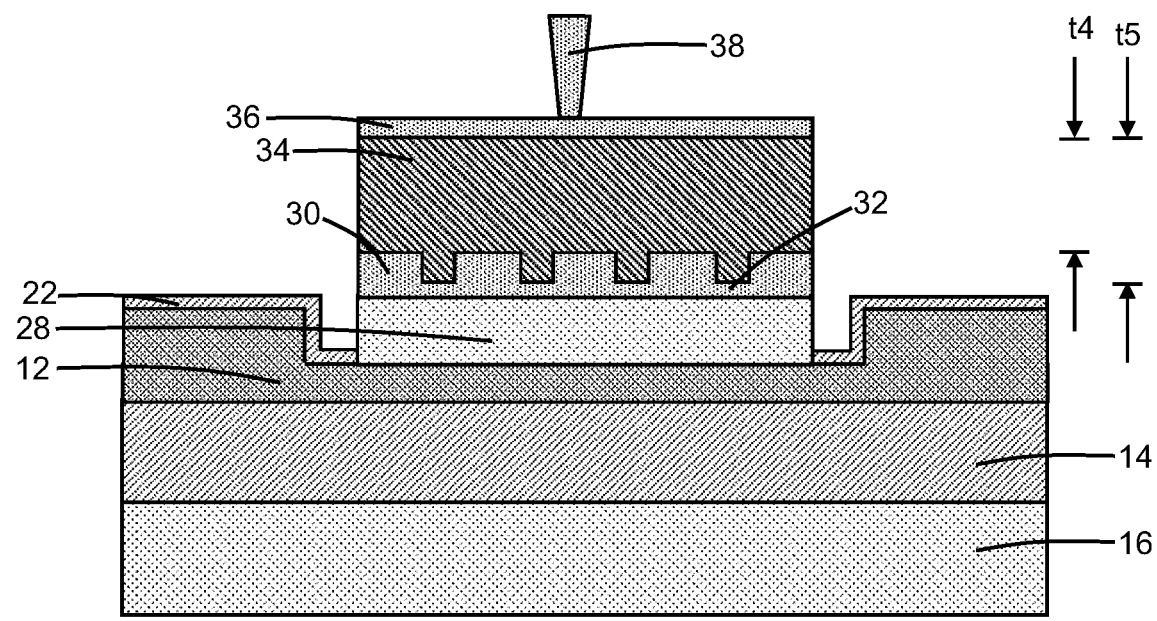
FIGS. 12, 12A are cross-sectional views of a structure in accordance with alternative embodiments.
Figure 12A:
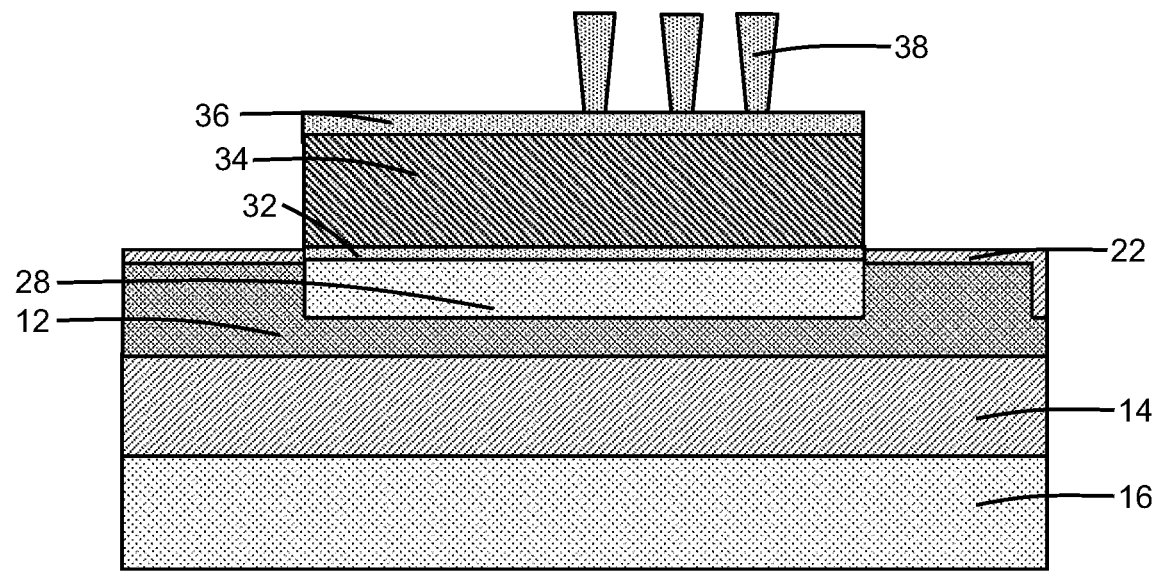

With reference to FIGS. 12, 12A in which like reference numerals refer to like features in FIGS. 11, 11A and at a subsequent fabrication stage of the processing method, the semiconductor layer 34 is formed on the semiconductor layer 28 over the doped regions 30 and doped layer 32. The doped regions 30 may be arranged in a one-dimensional array constituted by parallel strips of doped semiconductor material that alternate with strips of the semiconductor layer 34 in a horizontal plane. In that regard, portions of the semiconductor layer 34 are positioned in the trenches 46 between adjacent pairs of the doped regions 30 such that the absorption region of the avalanche photodetector is corrugated. The intrinsic semiconductor material of the semiconductor layer 34 has a varying thickness that varies with position in the horizontal plane between a thickness t4 and a thickness t5 that is greater than the thickness t4.

Processing continues to complete the device structure for the avalanche photodetector. The absorption region, charge sheet, and multiplication region of the avalanche photodetector are stacked in a vertical direction with a corrugated charge sheet and a corrugated absorption region.

Figure 13:
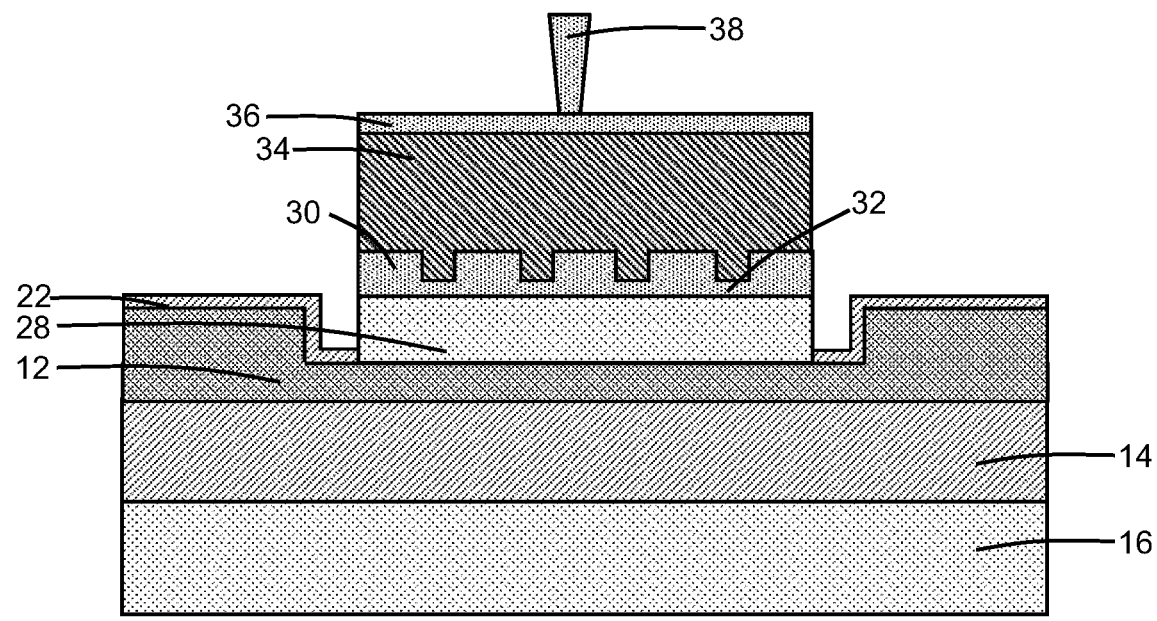
FIGS. 13, 13A are cross-sectional views of a structure in accordance with alternative embodiments.
Figure 13A:
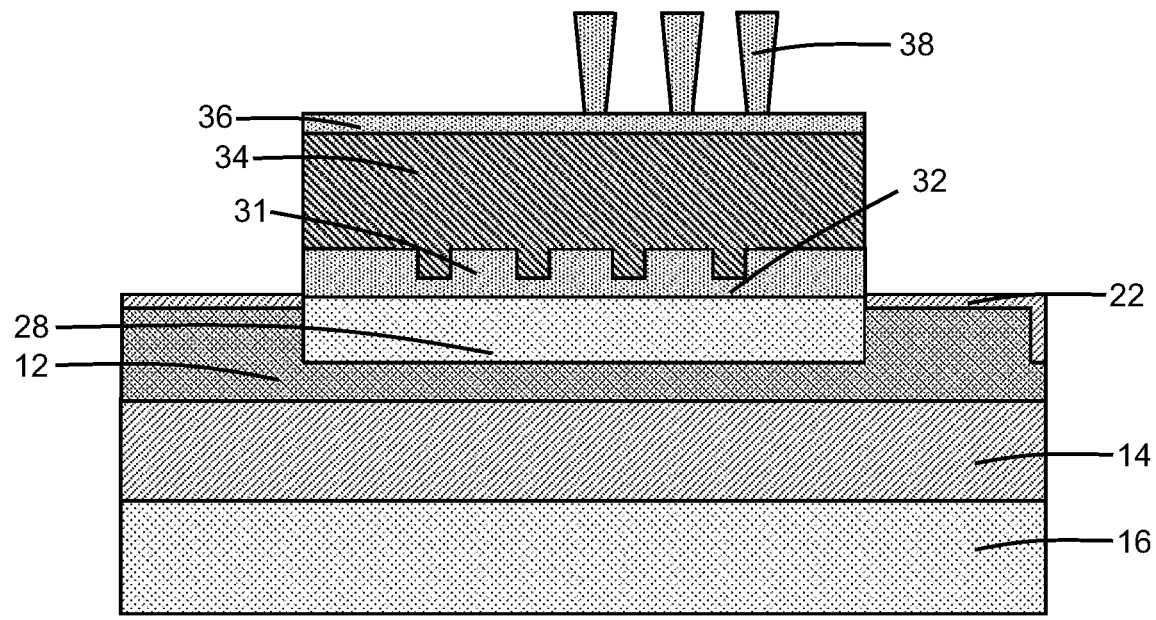

With reference to FIGS. 13, 13A in which like reference numerals refer to like features in FIGS. 12, 12A and in accordance with alternative embodiments, the trenches 46 patterned to form the doped regions 30 may be modified to also form the doped regions 31. In an embodiment, the doped regions 30, 31 may be formed in the rows and columns of a grid. In the representative embodiment, the doped regions 30, 31 alternate with the undoped regions of the semiconductor layer 28 in both dimensions in a horizontal plane to define a grid with the intrinsic semiconductor material of the semiconductor layer 34 arranged in the interstices of the grid. The intrinsic semiconductor material of the semiconductor layer 34 in the interstices has a varying thickness that varies with position in the horizontal plane between the thickness t4 and the thickness t5.

Figure 14:
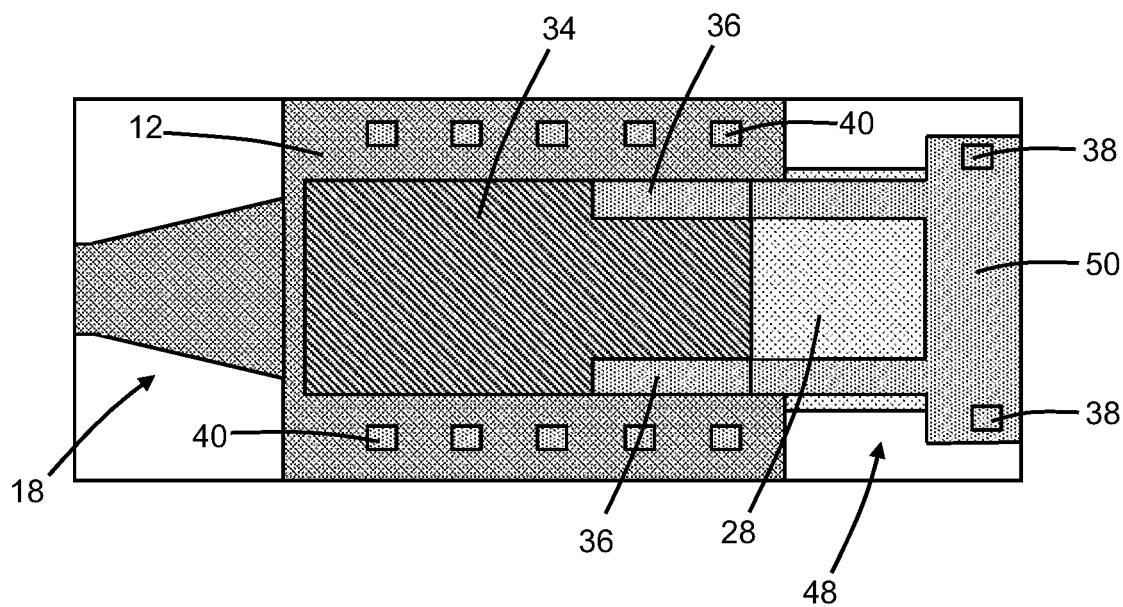
FIG. 14 is a top view of a structure in accordance with alternative embodiments of the invention.

With reference to FIG. 14 and in accordance with alternative embodiments, the contacts 38 may be moved from positions on the semiconductor layer 34 to positions on an extension 48 of the semiconductor layer 28. The doped layer 36 is modified through a modification to the implantation mask such that the doped layer 36 is arranged in sections at the edges of the semiconductor layer 34. These sections of the doped layer 36 are connected to a doped layer 50 formed in the extension 48 of the semiconductor layer 28. The extension 48 projects from the portion of the semiconductor layer 28 located beneath the semiconductor layer 34. The contacts 38 are electrically and physically connected to a portion of the doped layer 50 located in a widened section of the extension 48 of the semiconductor layer 28. The widened section of the extension 48 of the semiconductor layer 28 is arranged at an opposite end of the semiconductor layer 34 from the taper 18.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for an avalanche photodetector, the structure comprising:
   a first semiconductor layer including a first portion and a second portion, the first portion of the first semiconductor layer defining a multiplication region of the avalanche photodetector;
   a second semiconductor layer stacked in a vertical direction with the first semiconductor layer, the second semiconductor layer defining an absorption region of the avalanche photodetector;
   a charge sheet in the second portion of the first semiconductor layer, the charge sheet having a thickness that varies with position in a horizontal plane, the charge sheet positioned in the vertical direction between the second semiconductor layer and the first portion of the first semiconductor layer, the charge sheet including a first plurality of doped regions and a doped layer superimposed on the first plurality of doped regions, the first plurality of doped regions and the doped layer each containing a dopant of a first conductivity type, the first plurality of doped regions having a first thickness, and the doped layer having a second thickness that is less than the first thickness; and
   a pad comprising a semiconductor material having a second conductivity type different than the first conductivity type,
   wherein the first semiconductor layer and the second semiconductor layer are positioned on the pad.

2. The structure of claim 1 wherein the second portion of the first semiconductor layer comprises intrinsic silicon, and the second semiconductor layer comprises intrinsic germanium.

3. The structure of claim 1 further comprising:
   a second doped layer in the second semiconductor layer; and
   a contact connected to the second doped layer.

4. The structure of claim 3 wherein the second doped layer contains the dopant of the first conductivity type.

5. The structure of claim 3 wherein the second semiconductor layer comprises intrinsic germanium that is positioned in the vertical direction between the charge sheet and the second doped layer.

6. The structure of claim 1 wherein the first plurality of doped regions are arranged in a one-dimensional array of strips.

7. The structure of claim 6 wherein the second semiconductor layer includes a plurality of portions, and each portion of the second semiconductor layer is arranged in a lateral direction between an adjacent pair of the first plurality of doped regions.

8. The structure of claim 1 wherein the charge sheet includes a second plurality of doped regions having the second thickness, and the second plurality of doped regions are arranged to intersect the first plurality of doped regions to define a grid.

9. The structure of claim 8 wherein the second semiconductor layer includes a plurality of portions that are positioned in interstices of the grid.

10. The structure of claim 1 wherein the second portion of the first semiconductor layer is a mesa having first lateral dimensions in the horizontal plane, the first portion of the first semiconductor layer has second lateral dimensions in the horizontal plane, and the second lateral dimensions are greater than the first lateral dimensions.

11. The structure of claim 1 wherein the pad includes a recessed portion, and the first semiconductor layer and the second semiconductor layer are positioned in the recessed portion of the pad.

12. The structure of claim 11 wherein the pad includes a first raised portion and a second raised portion, the recessed portion is laterally positioned between the first raised portion and the second raised portion, and further comprising:
a first contact connected to the first raised portion of the pad;
a second contact connected to the second raised portion of the pad; and
a third contact connected to the second semiconductor layer.

13. The structure of claim 1 further comprising:
a buried insulator layer; and
a handle substrate separated from the pad by the buried insulator layer.

14. A structure for an avalanche photodetector, the structure comprising:
a first semiconductor layer including a first portion, a second portion, and an extension that projects from the first portion, the first portion of the first semiconductor layer defining a multiplication region of the avalanche photodetector;
a second semiconductor layer stacked in a vertical direction with the first semiconductor layer, the first portion of the first semiconductor layer located beneath the second semiconductor layer, and the second semiconductor layer defining an absorption region of the avalanche photodetector; and
a charge sheet in the second portion of the first semiconductor layer, the charge sheet having a thickness that varies with position in a horizontal plane, and the charge sheet positioned in the vertical direction between the second semiconductor layer and the first portion of the first semiconductor layer;
a second doped layer in the second semiconductor layer;
a third doped layer in the extension of the first semiconductor layer, the third doped layer connected to the second doped layer; and
a contact connected to the third doped layer.

15. The structure of claim 14 wherein the charge sheet contains a dopant of a first conductivity type, and further comprising:
a pad comprised of a semiconductor material having a second conductivity type different than the first conductivity type,
wherein the first semiconductor layer and the second semiconductor layer are positioned on the pad.

16. The structure of claim 15 further comprising:
a buried insulator layer; and
a handle substrate separated from the pad by the buried insulator layer.

17. The structure of claim 14 wherein the second portion of the first semiconductor layer comprises intrinsic silicon, and the second semiconductor layer comprises intrinsic germanium.

18. A method of forming a structure for an avalanche photodetector, the method comprising:
forming a first semiconductor layer including a first portion defining a multiplication region of the avalanche photodetector;
forming a charge sheet in a second portion of the first semiconductor layer, wherein the charge sheet has a thickness that varies with position in a horizontal plane; and
forming a second semiconductor layer stacked in a vertical direction with the first semiconductor layer, wherein the second semiconductor layer defines an absorption region of the avalanche photodetector, and the charge sheet is positioned in the vertical direction between the second semiconductor layer and the first portion of the first semiconductor layer,
wherein the charge sheet includes a first plurality of doped regions and a doped layer superimposed on the first plurality of doped regions, the first plurality of doped regions and the doped layer each containing a dopant of a first conductivity type, the first plurality of doped regions having a first thickness, the doped layer having a second thickness that is less than the first thickness, and the first semiconductor layer and the second semiconductor layer are positioned on a pad comprising a semiconductor material having a second conductivity type different than the first conductivity type.

19. The method of claim 18 further comprising:
forming a second doped layer in the second semiconductor layer; and
forming a contact connected to the second doped layer.

20. The method of claim 19 wherein the second doped layer contains the dopant of the first conductivity type, and the second semiconductor layer comprises intrinsic germanium that is positioned in the vertical direction between the charge sheet and the second doped layer.

\* \* \* \* \*